United States Patent
Halonen et al.

(10) Patent No.: US 10,606,256 B2
(45) Date of Patent: Mar. 31, 2020

(54) METHOD TO PREVENT PARASITIC CURRENT DRAIN OF A VEHICLE BATTERY

(71) Applicant: GM GLOBAL TECHNOLOGY OPERATIONS LLC, Detroit, MI (US)

(72) Inventors: Dean R. Halonen, Brighton, MI (US); Chans C. Head, Royal Oak, MI (US); Cole E. Leether, Sterling Heights, MI (US); Joshua D. Smith, Fowlerville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 92 days.

(21) Appl. No.: 15/946,057

(22) Filed: Apr. 5, 2018

(65) Prior Publication Data

US 2019/0310623 A1     Oct. 10, 2019

(51) Int. Cl.
*G05D 1/00* (2006.01)
*F02P 11/00* (2006.01)
*G07C 5/00* (2006.01)
*G07C 5/08* (2006.01)
*H04W 4/14* (2009.01)
*H04L 29/08* (2006.01)

(52) U.S. Cl.
CPC ............ *G05D 1/0011* (2013.01); *F02P 11/00* (2013.01); *G07C 5/008* (2013.01); *G07C 5/0808* (2013.01); *G07C 5/0825* (2013.01); *H04L 67/12* (2013.01); *H04W 4/14* (2013.01)

(58) Field of Classification Search
CPC ...... G05D 1/0011; F02P 11/00; G07C 5/0808; G07C 5/0825; H04L 67/12; H04W 4/14
USPC .......................................................... 701/2
See application file for complete search history.

(56) References Cited

U.S. PATENT DOCUMENTS

| | | | |
|---|---|---|---|
| 2011/0082621 A1* | 4/2011 | Berkobin | B60L 58/10 701/31.4 |
| 2014/0375118 A1* | 12/2014 | Namuduri | B60R 16/033 307/9.1 |
| 2018/0236890 A1* | 8/2018 | Cyrne | B60L 3/12 |
| 2019/0176642 A1* | 6/2019 | Diab | B60W 20/00 |

* cited by examiner

*Primary Examiner* — Tan Q Nguyen

(57) ABSTRACT

A method to prevent parasitic current drain of a vehicle battery includes shutting off the vehicle ignition to initiate a power down sequence of electronic control units, and detecting an excessive current draw condition from the vehicle battery after the vehicle ignition is shut off for a predetermined period of time. After verifying that an excessive current draw condition exists by analyzing data collected from the vehicle, the method continues with powering up the electronic control units on a vehicle communications network and broadcasting a system state equals run, and broadcasting a system state equals off on the vehicle communications network after the electronic control units have reached steady state operation.

18 Claims, 3 Drawing Sheets

METHOD TO PREVENT PARASITIC CURRENT DRAIN OF A VEHICLE BATTERY

TECHNICAL FIELD

The embodiments described herein relate generally to monitoring of storage of energy in an electrical storage battery on a motorized vehicle, such as an automobile, truck, motorcycle, or watercraft.

BACKGROUND

The electrical storage battery on a motorized vehicle has historically been a crucial component, the battery being used not only as a source of energy for cranking the vehicle's engine during a startup, but also as a ballast for storing electrical energy, in conjunction with the charging system and voltage regulation circuitry during vehicle operation. The battery has to have adequate state of charge for starting the vehicle's engine, in the variety of environmental conditions in which the vehicle is to be operated, including a wide range of temperature extremes.

In modern versions of motorized vehicles, the battery serves the additional function of supplying electrical currents to various systems other than the vehicle's starter motor during start-up. Such systems may include vehicle security systems, which periodically "wake up", or are called to wake up by the vehicle's operator. Other such systems include keyless remote wireless access devices. In addition, electronic control systems ("ECS") for engine and accessory management during operation rely on an electrical system featuring a battery. Thus, a battery is desirously of high reliability to ensure proper and complete vehicle design functionality. Hence, failure of the battery may manifest itself in several symptoms, including a vehicle no-start situation.

Battery "parasitic load" is the electrical load presented on a vehicle when the ignition key is in the off position, which load may be constant or intermittent. Excessive parasitic load can drain a battery to a low state of charge ("SOC") which can prevent the vehicle from being started at a later point in time. Furthermore, a relatively low SOC can be harmful to battery life, especially for batteries which are not designed to tolerate repeated deep charge cyclings. This may be most pronounced in modern vehicles as the number of on-board computer modules which need to wake up periodically during ignition-off situation are increased.

Conditions of excessive parasitic load may be easy to detect, but if there is no means to readily address the issue then the battery SOC could become substantially depleted resulting in a no start condition. Accordingly, there is a desire to process for detecting and resolve battery drain due to excessive parasitic current.

SUMMARY

One or more exemplary embodiments address the above issue by providing a method to prevent parasitic current drain of a vehicle battery. In accordance with an exemplary embodiment, aspects of the method include shutting off the vehicle ignition to initiate a power down sequence of electronic control units, and detecting an excessive current draw condition from the vehicle battery after the vehicle ignition is shut off for a predetermined period of time. Another aspect of the exemplary embodiment includes verifying the excessive current draw condition based on data collected from the vehicle following shutting off the vehicle ignition and expiration of the predetermined period of time. And another aspect includes powering up a master electronic control unit on a vehicle communications network to verify the excessive current draw condition exists.

And a further aspect in accordance with the exemplary embodiment wherein detecting further includes using an intelligent battery sensor. Still further aspects wherein verifying further includes collecting data in a body control module from the intelligent battery sensor and sending the collected data to a remote office, and analyzing the collected data at the remote office to determine if remedial action software should be enabled by the remote office due to the excessive current draw condition. And still a further aspect includes enabling the remedial action software to the vehicle from the remote office when it is verified that the excessive current draw condition exists. And yet further aspects wherein broadcasting further includes resetting communications circuits of all electronic control units on the vehicle communications network and broadcasting system state equals off if the excessive current draw condition continues, and resetting the electronic control units on the vehicle communications network and broadcasting system state equals off if the excessive current condition continues after resetting the communications circuits.

Still another aspect according to the exemplary embodiment includes providing an alert to the vehicle operator that the vehicle should be serviced if the excessive current draw continues. And other aspects wherein providing an alert further includes providing a text alert from the remote office when prior authorization to send such alerts has been obtained, and/or activating a battery service lamp.

BRIEF DESCRIPTION OF THE DRAWINGS

Embodiments of disclosed method may take physical form in certain parts and arrangement of parts, the preferred embodiment of which will be described in detail and illustrated in the accompanying drawings which form a part hereof, and wherein.

DETAILED DESCRIPTION

Figure 1:
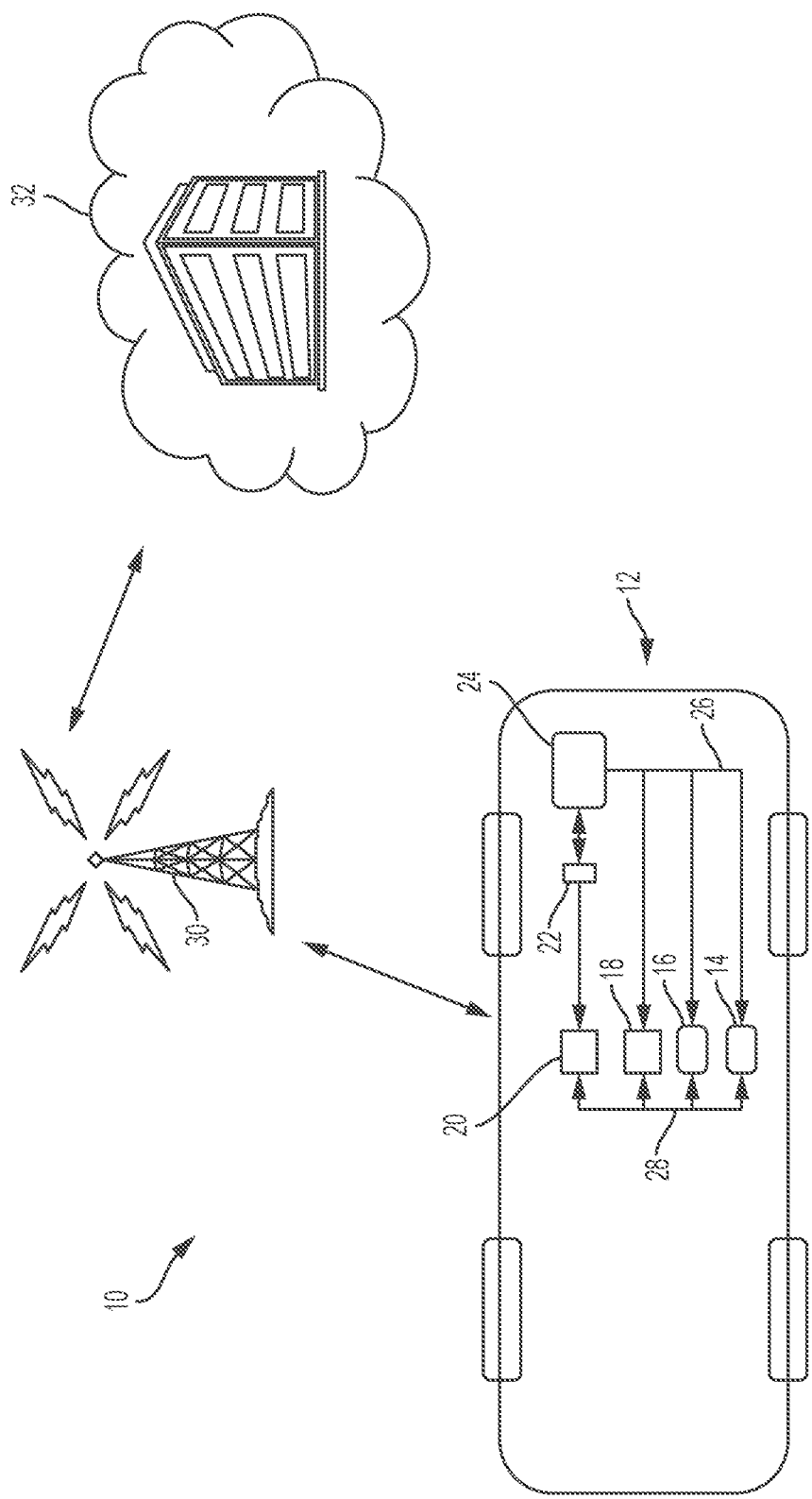
FIG. 1 graphically illustrates a vehicle system configured for the disclosing the method to prevent parasitic current drain of a vehicle battery in accordance with an exemplary embodiment.

Referring now to the drawings, wherein the showings are for the purpose of illustrating certain exemplary embodiments only, and not for the purpose of limiting the same, FIG. 1 graphically illustrates a vehicle system configured for the disclosing the method to prevent parasitic current drain of a vehicle battery.

The system 10 for a vehicle 12 having electronic control units (14, 16, 18, and 20), and at least one sensor 22 in electrical communication with a conventional 12-Volt battery 24. The control units include a transmission control module (TCM) 14, an engine control module (ECM) 16, telematics module 18 and a body control module (BCM) 20. In accordance with the exemplary embodiment, the at least one sensor 22 is an intelligent battery sensor (IBS) configured to continuously analyze the status of the 12-Volt batteries and to provide information on such key parameters as the state-of-charge, state-of-function (power ability) and state-of-health (aging) of the battery 24.

The ECM 16 operates as the "brain" of a vehicle and controls a plurality of actuators on an internal combustion engine to ensure optimal engine performance. The TCM 14 receives electrical signals from various sensors and data from the ECM 16 to regulate the gear shifting for optimal vehicle performance. The telematics module 18 is configured to manage exchange of information between the on-board controllers for exchanging information with a location that is remote from the vehicle, e.g., remote office or server, that can be uploaded, such as by wireless transmission. As such, vehicle performance data may be remotely stored, monitored, analyzed, and/or manipulated for diagnostic purposes. In accordance with the preferred embodiment, the IBS 22 is also in communication with the BCM 20 which is configured for collecting and storing data received from the IBS 22 as well as for controlling such functions as power door, power seats, and wipers.

The battery 24 is also in electrical communication with the TCM 14, ECM 16, telematics module 18, and the BCM 20 through an assortment of electrical wires 26 for providing power to the control modules (14, 16, 18, and 20). It is appreciated that the vehicle system 10 may include additional control modules and additional sensors that cooperate to control and monitor the several functionalities of the vehicle that are not discussed herein but may be included in the vehicle system 10 without exceeding the scope of the exemplary embodiment.

The control units (14, 16, 18, and 20) are connected using one or more network connections, such as a communications network 28. The communications network allows the control modules (14, 16, 18, and 20) to send and receive data between on-board control units in addition to exchanging information with off-board locations. Examples of suitable network connections include a controller area network (CAN), a media oriented system transfer (MOST), a local interconnection network (LIN), a local area network (LAN), and other appropriate connections such as Ethernet or others that conform with known ISO, SAE and IEEE standards and specifications, to name but a few.

As discussed above, the telematics module 18 is operative to communicate wirelessly through at least one cellular network 30 with at least one remote location or object. For example, the telematics module 18 is capable of with other similarly equipped vehicles, remote servers, mobile devices, and a remote office 32. Through this wireless connection 30, the remote office 32 is capable of monitoring various vehicle subsystems for functionality, capable of diagnosing conditions that may cause certain vehicle subsystems to fail. Likewise, the wireless connection 30 allows for the vehicle 12 to have remedial action software stored on the vehicle enabled by the remote office, as well as, to have remedial action software received via over the air (OAT) flashes from the remote office 32 that can resolve remotely diagnosed issue without having the vehicle 12 being taken in for service in accordance with the exemplary embodiment.

Figure 2:
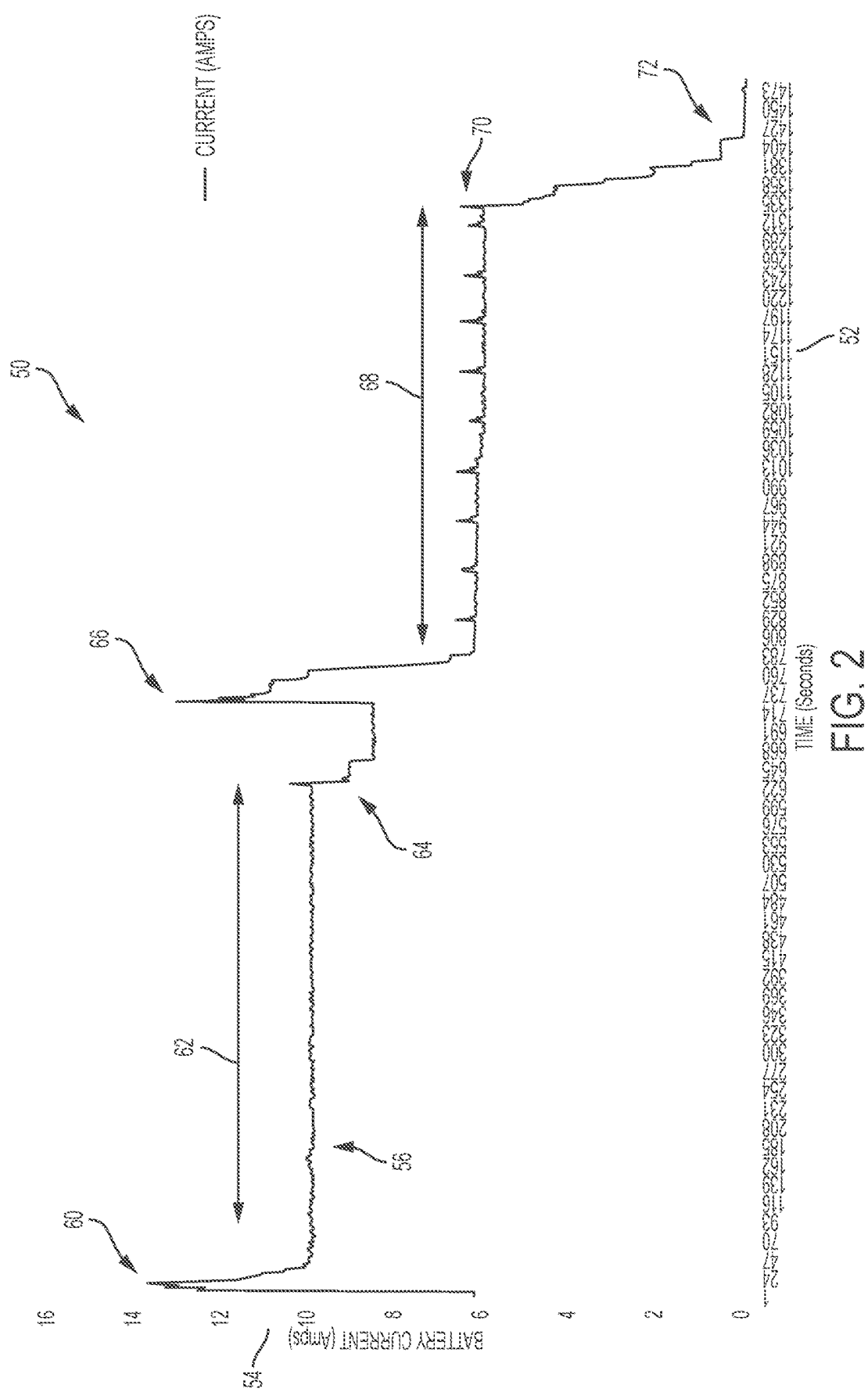
FIG. 2 graphically illustrates the effects on parasitic current draw over time after initiation of the method to prevent parasitic current drain of a vehicle battery in accordance with the exemplary embodiment.

Referring now to FIG. 2, a graph 50 illustrates the effects on parasitic current draw over time after initiation of the method to prevent parasitic current drain of a vehicle battery in accordance with aspects of the exemplary embodiment. The X axis 52 of the graph 50 represents time in (Seconds) and the Y axis represents battery Current in (Amperes). The line 56 graphically represents the varying battery Current versus time in seconds.

Beginning at 60, the ignition of the vehicle 12 is turned off to initiate a shutdown sequence for the control units (14, 16, 18, 20) on the communication network 28 on the vehicle 12. During the time period 62, at least one of the control units on the communications network has shut down but at 64 at least one other control unit remains on and continues to draw current from the battery which is being sensed by the IBS 22. At 66, a verification is made at the remote office 32 that an excessive current draw condition exist and a remedial action software (Smitty Cycle) is enabled from the remote office 32 and loaded on the vehicle 12.

The remedial action software or Smitty Cycle begins a three tier protection approach to resolving the excessive current draw condition from the battery. At Tier 1, the remedial action software starts with powering up a master electronic control unit on a vehicle communications network to verify the excessive current draw condition exists. Thereafter, a system state equals Off is broadcasted on the vehicle communications network after the electronic control units have reached steady state operation. If the Tier 1 stage of the remedial action software does not resolve the excessive current draw condition then a Tier 2 stage is performed by resetting the communications circuits of the control units on the network and then broadcasting a system state Off to all of the control units on the communications network.

If and performing the Tier 2 stage of the remedial action software does not resolve the excessive current draw condition then a Tier 3 stage of the software in initiated. At the Tier 3 stage the remedial action software continues with resetting all of the control units on the communications network and then broadcasting a system state equals Off.

If any one of the Tiers of the remedial action software is performed and the excessive current draw condition is resolved then, during the period 68, at least one of the control units on the communications network 28 goes to sleep while at least one other control unit stays awake for a period of time until at 70 where at least one other of the control units that remained awake goes to sleep. Finally, at 72, all of the control units on the communications network 28 goes to sleep such that the excessive current draw condition is resolved and the vehicle is in proper sleep mode.

Figure 3:
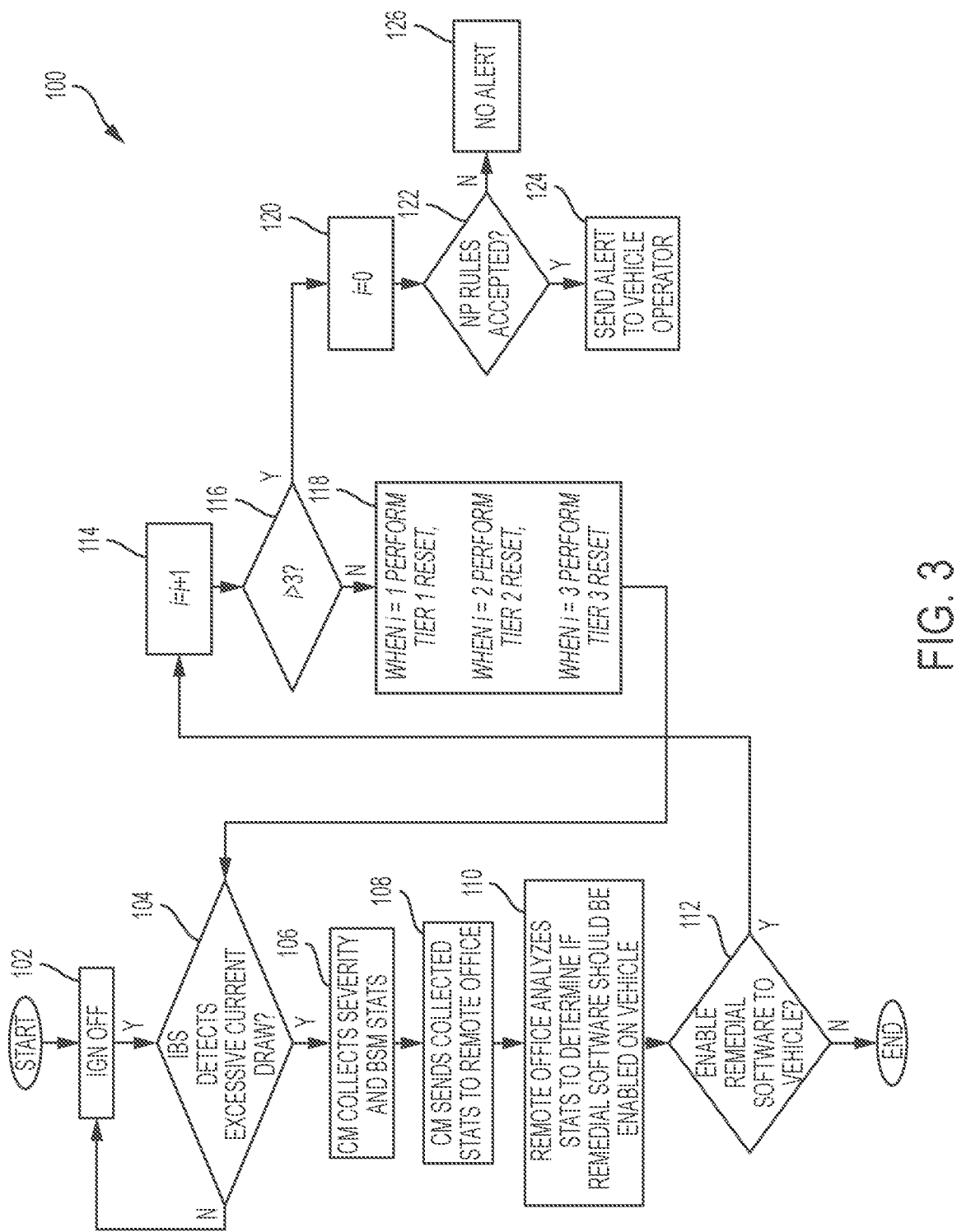
FIG. 3 illustrates a flow diagram of the method to prevent parasitic current drain of a vehicle battery in accordance with the exemplary embodiment.

Referring now to FIG. 3, a flow diagram of the method to prevent parasitic current drain of a vehicle battery in accordance with the exemplary embodiment is provided. At block 102, the method begins with shutting off the vehicle ignition to initiate a power down sequence of electronic control units. At block 104, the IBS sensor is used for detecting an excessive current draw condition from the vehicle battery after the vehicle ignition is shut off for a predetermined period of time.

At block 106, the IBS sensor data is collected and stored in a control unit, preferably the BCM in accordance with the exemplary embodiment. However, it is appreciated that the IBS data can be collected and stored in another control unit suitable for such purpose without exceeding the scope of the invention. Then at block 108, the control unit wirelessly sends the collected data (stats) to a remote office.

At block 110, the wirelessly received stats data is verified and analyzed to determine if remedial action software should be enabled by the remote office on the vehicle. At block 112, if it is determined that remedial action software does not need to be enabled on the vehicle then the method ends. If it is determined that remedial action software needs to be enabled on the vehicle then, at block 114, a counter is defined to i=i+1 where i starts at zero. At block 116, the value of the counter is checked to determine if the count value is greater than 3. If the counter is not greater than 3 then, at block 118 the three (3) Tier remedial action software that was enabled on the vehicle is initiated.

In the Tier 1 stage of the remedial action software the remedial action software starts with powering up a master electronic control unit on a vehicle communications network to verify the excessive current draw condition exists. Thereafter, a system state equals "Off" is broadcasted on the vehicle communications network after the electronic control units have reached steady state operation. If the Tier 1 stage of the remedial action software does not resolve the excessive current draw condition then a Tier 2 stage is performed by resetting the communications circuits of the control units on the network and then broadcasting a system state "Off" to all of the control units on the communications network.

If and performing the Tier 2 stage of the remedial action software does not resolve the excessive current draw condition then a Tier 3 stage of the software in initiated. At the Tier 3 stage the remedial action software continues with resetting all of the control units on the communications network and then broadcasting a system state equals "Off".

If any one of the Tiers of the remedial action software is performed and the excessive current draw condition is resolved then the method is exited.

If at block 116 it is determined that the counter is greater than three (3) then, at block 120, the counter is reset to zero and at block 122, the method determines if notification policy rules have be accepted which authorizes the remote office to send a text message directly to the driver's mobile device or the vehicle. If so, then, at block 124, an alert text is sent directly to the vehicle operator or to the vehicle, or other suitable device that the vehicle needs to be taken in for service for electrical system issues. Alternatively, an alert can be sent to the vehicle by activating a battery service lamp of the instrument panel cluster.

Finally, at block 126, if the notification policy rules have not been accepted then no text alert is sent but in the alternative a battery service lamp may be activated to alert the vehicle operator of the battery issue.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

What is claimed is:

1. A method to prevent parasitic current drain of a vehicle battery comprising:
   shutting off the vehicle ignition to initiate a power down sequence of electronic control units;
   detecting an excessive current draw condition from the vehicle battery after the vehicle ignition is shut off for a predetermined period of time;
   verifying the excessive current draw condition based on data collected from the vehicle following shutting off the vehicle ignition and expiration of the predetermined period of time; and
   broadcasting a system state equals off on the vehicle communications network.

2. The method of claim 1 wherein detecting further comprises using an intelligent battery sensor.

3. The method of claim 2 wherein verifying further comprises collecting data in a body control module from the intelligent battery sensor and sending the collected data to a remote office.

4. The method of claim 3 wherein verifying further comprises analyzing the collected data at the remote office to determine if remedial action software should be enabled by the remote office due to the excessive current draw condition.

5. The method of claim 4 further comprising enabling the remedial action software on the vehicle from the remote office when it is verified that the excessive current draw condition exists.

6. The method of claim 1 wherein broadcasting further comprises resetting communications circuits of all electronic control units on the vehicle communications network and broadcasting system state equals off if the excessive current draw condition continues.

7. The method of claim 6 wherein broadcasting further comprising resetting the electronic control units on the vehicle communications network and broadcasting system state equals off if the excessive current condition continues.

8. The method of claim 7 further comprising providing an alert to the vehicle operator that the vehicle should be serviced if the excessive current draw continues.

9. The method of claim 8 wherein providing an alert further comprises providing a text alert from the remote office when prior authorization to send such alerts has been obtained.

10. The method of claim 8 wherein providing an alert further comprises activating a battery service lamp.

11. A method to prevent parasitic current drain of a vehicle battery comprising:
    shutting off the vehicle ignition to initiate a power down sequence of electronic control units;
    detecting an excessive current draw condition from the vehicle battery after the vehicle ignition is shut off for a predetermined period of time;
    verifying the excessive current draw condition based on data collected from the vehicle following shutting off the vehicle ignition and expiration of the predetermined period of time; and
    broadcasting a system state equals off on the vehicle communications network after the electronic control units have reached steady state operation, and resetting communications circuits of all electronic control units on the vehicle communications network and broadcasting system state equals off if the excessive current draw condition continues, wherein broadcasting further includes resetting the electronic control units on the vehicle communications network and broadcasting system state equals off if the excessive current condition continues.

12. The method of claim 11 wherein detecting further comprises using an intelligent battery sensor.

13. The method of claim 12 wherein verifying further comprises collecting data in a body control module from the intelligent battery sensor and sending the collected data to a remote office.

14. The method of claim 13 wherein verifying further comprises analyzing the collected data at the remote office to determine if remedial action software should be enabled by the remote office due to the excessive current draw condition.

15. The method of claim 14 further comprising enabling the remedial action software to the vehicle from the remote office when it is verified that the excessive current draw condition exists.

16. The method of claim 11 further comprising providing an alert to the vehicle operator that the vehicle should be serviced if the excessive current draw continues.

17. The method of claim 16 where providing an alert further comprises providing a text alert from the remote office when prior authorization to send text alerts from the remote office has been obtained.

18. The method of claim 16 wherein providing an alert further comprises activating a battery service lamp.

\* \* \* \* \*